United States Patent
Ohashi

(10) Patent No.: US 8,105,959 B2
(45) Date of Patent: Jan. 31, 2012

(54) METHOD FOR MANUFACTURING A SEMICONDUCTOR DEVICE HAVING A NITROGEN-CONTAINING GATE INSULATING FILM

(75) Inventor: Takuo Ohashi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 1252 days.

(21) Appl. No.: 11/697,050

(22) Filed: Apr. 5, 2007

(65) Prior Publication Data
US 2007/0238316 A1    Oct. 11, 2007

(30) Foreign Application Priority Data
Apr. 6, 2006 (JP) .................................. 2006-105442

(51) Int. Cl.
*H01L 21/31* (2006.01)
(52) U.S. Cl. ................. 438/775; 438/792; 257/E21.302
(58) Field of Classification Search .......... 438/775–777, 438/791, 792; 257/E21.302
See application file for complete search history.

(56) References Cited

U.S. PATENT DOCUMENTS

| | | | | |
|---|---|---|---|---|
| 4,398,339 | A * | 8/1983 | Blanchard et al. ............. | 438/271 |
| 6,309,932 | B1 * | 10/2001 | Ma et al. ....................... | 438/287 |
| 6,348,420 | B1 | 2/2002 | Raaijmakers et al. | |
| 6,638,879 | B2 * | 10/2003 | Hsieh et al. ................... | 438/791 |
| 6,821,868 | B2 * | 11/2004 | Cheng et al. .................. | 438/517 |
| 6,861,375 | B1 * | 3/2005 | Nakaoka et al. ............... | 438/775 |
| 6,933,245 | B2 * | 8/2005 | Lee et al. ....................... | 438/778 |
| 7,545,001 | B2 * | 6/2009 | Cheng et al. .................. | 257/357 |
| 2003/0059535 | A1 * | 3/2003 | Luo et al. ................. | 427/255.28 |
| 2003/0190821 | A1 * | 10/2003 | Buchanan et al. ............ | 438/790 |
| 2003/0232491 | A1 | 12/2003 | Yamaguchi | |
| 2005/0045967 | A1 | 3/2005 | Sasaki et al. | |
| 2006/0079077 | A1 | 4/2006 | Takahashi | |
| 2006/0292844 | A1 * | 12/2006 | Olsen ........................... | 438/591 |

FOREIGN PATENT DOCUMENTS

| | | |
|---|---|---|
| JP | 59-084460 A | 5/1984 |
| JP | 2001-237243 A | 8/2001 |
| JP | 2002-203961 A | 7/2002 |
| JP | 2002-203961 A | 7/2002 |
| JP | 2003-218106 A | 7/2003 |
| JP | 2004-022902 A | 1/2004 |
| JP | 2005-079308 A | 3/2005 |
| JP | 2006-073758 A | 3/2006 |
| JP | 2006-108493 A | 4/2006 |
| JP | 2007-194239 A | 8/2007 |

OTHER PUBLICATIONS

Office Action issued Oct. 11, 2011 by the Japanese Patent Office in counterpart Japanese Patent Application No. 2006-105442.

* cited by examiner

*Primary Examiner* — David Vu
(74) *Attorney, Agent, or Firm* — Sughrue Mion, PLLC

(57) ABSTRACT

A method for manufacturing a semiconductor device includes the steps of: forming a $SiO_2$ layer on a silicon substrate; forming on the $SiO_2$ layer an SiN film having a N/Si composition ratio smaller than the stoichiometric composition ratio of SiN by using the ALD technique; and performing a plasma-nitriding process on the SiN layer at a substrate temperature of 550 degrees C. or below.

18 Claims, 6 Drawing Sheets

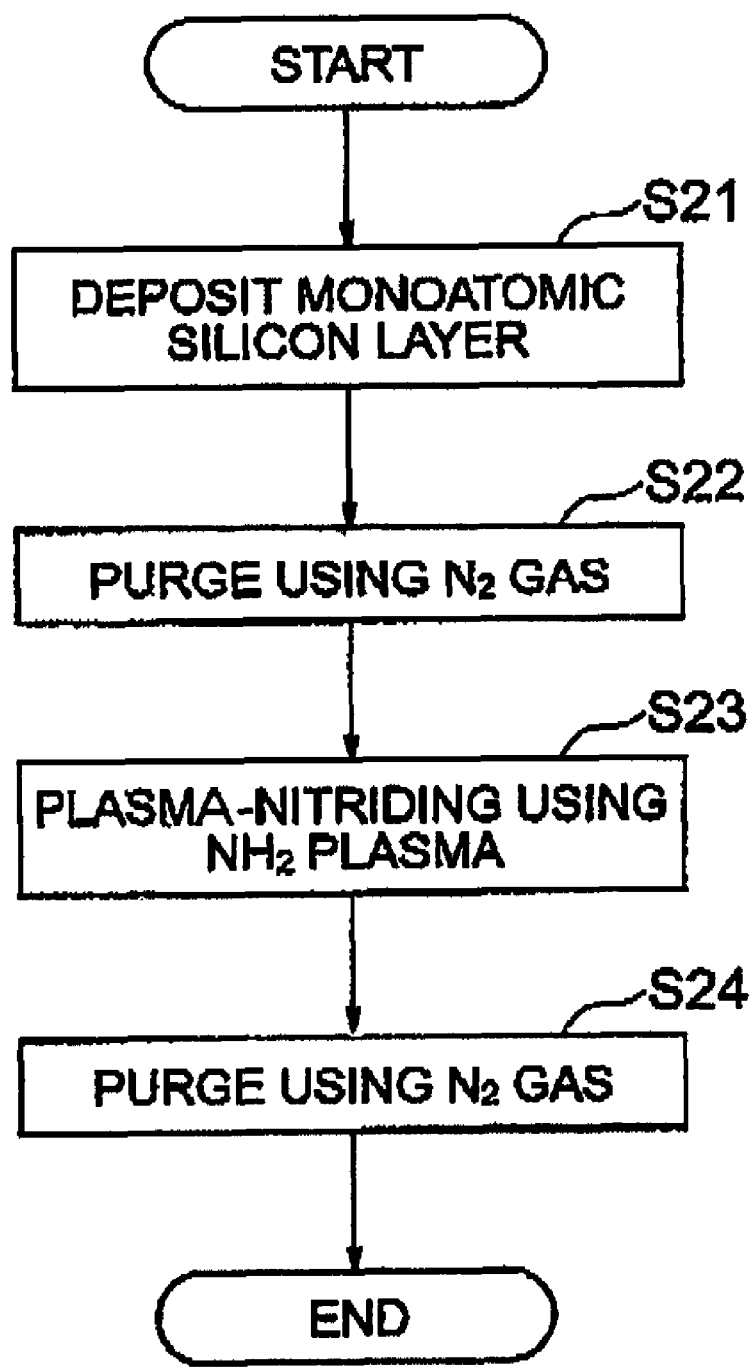

METHOD FOR MANUFACTURING A SEMICONDUCTOR DEVICE HAVING A NITROGEN-CONTAINING GATE INSULATING FILM

BACKGROUND OF THE INVENTION

1. Field of the Invention

The present invention relates to a method for manufacturing a semiconductor device. More specifically, the present invention relates to a technique for forming a nitrogen-containing gate insulating film on a silicon substrate of a semiconductor device.

2. Description of the Related Art

Along with wider spread of mobile electronic products, there is an increasing demand for reduced power dissipation in a semiconductor device. To cope with this demand, a technique is adopted to introduce nitrogen into a gate insulating film of a FET (Field Effect Transistor) to allow reduction in the thickness of the gate insulating film. The nitrogen introduced into the gate insulating film improves the withstand voltage thereof and also prevents impurities from diffusing through the gate insulating film.

During introduction of the nitrogen into the gate insulating film, it is desired to suppress diffusion of the nitrogen toward the interface between the gate insulating film and the silicon substrate. The introduced nitrogen is likely to accumulate in the vicinity of the interface with respect to the silicon substrate, and the accumulated nitrogen causes generation of fixed charge which is undesirable. The increase of the fixed charge causes a variety of characteristic degradations in the FET, such as an increased range of variation or a fluctuation in the threshold voltage Vth thereof and decrease in the carrier mobility. Thus, formation of the nitrogen-containing gate insulating film should be accompanied by a technique for preventing the nitrogen from accumulating in the vicinity of the interface with respect to the silicon substrate. In one technique, a $SiO_2$ layer and a SiN layer are consecutively deposited on the silicon substrate to provide a two-layer gate insulating film.

Patent Publication JP-2002-203961A describes the technique for forming the two-layer gate insulating film including the $SiO_2$ layer and the SiN layer which are consecutively deposited on the silicon substrate.

To improve the reliability of the gate insulating film, the process for forming the SiN layer may use the atomic-layer-deposition (AL)) technique that repeats deposition of a monoatomic layer in a desired number of times to obtain a desired thickness of the film. In an ALD process for forming a desired thickness of the SN film, deposition of a monoatomic silicon layer and nitriding the same to form a SiN monoatomic layer should be repeated in a specific number of times. The ALD technique obtains a desired thickness of an intended film by repeating formation of a monoatomic layer having an accurately controlled film quality, and thus has an advantage in providing the intended film superior in controllability for the film thickness and composition and in in-plane uniformity.

However, the gate insulating film configured by a SiN film, even if it is formed by the ALD technique, cannot negate the problem of the increase in the fixed charge, as described above, and causes the characteristic degradations of the FET, such as encountered by the nitrogen accumulated in the vicinity of the interface between the gate insulating film and the silicon substrate. For ensuring excellent FET characteristics, it is necessary to suppress the nitrogen in the SiN film from diffusing toward the vicinity of the interface between the gate insulating film and the silicon substrate, and yet to increase the nitrogen concentration in the SiN film up to a sufficient level in the vicinity of top of the gate insulating film opposite to the interface.

In view of the problems as discussed above, it is an object of the present invention to provide a method for manufacturing a semiconductor device including a nitrogen containing gate insulating film formed on a silicon substrate. More specifically, it is an object of the present invention to manufacture a semiconductor device including a FET having excellent characteristics, by suppressing nitrogen from diff-using toward the vicinity of the interface between the SiN gate insulating film and the silicon substrate and yet increasing nitrogen concentration in the vanity of the top of the gate insulating film that is opposite to the interface.

SUMMARY OF THE INVENTION

After conducting keen examination, the inventor obtained a finding that the nitrogen concentration in the SiN film is largely reduced compared to the stoichiometric nitrogen concentration by forming the SiN film on a $SiO_2$ film in an ALD process using dichlorosilane ($SiH_2Cl_2$) as a silicon source, and ammonia ($NH_3$) in a plasma state as a nitrogen source. Based on this finding, the present invention provides a method for forming a gate insulating film having a nitrogen concentration profile showing a lower nitrogen concentration in the vicinity of the interface between the gate insulating film and the silicon substrate and a higher nitrogen concentration in the vicinity of the top of the gate insulating film The present invention provides a method for manufacturing a semiconductor device including the steps of: forming a nitrogen-containing silicon film on a silicon substrate, the nitrogen-containing silicon film having a nitrogen concentration lower than a stoichiometric nitrogen concentration of a SiN film; and nitriding the nitrogen-containing silicon film to form a nitrogen-containing gate insulating film.

In accordance with the method of the present invention, since the nitrogen-containing silicon film forming step provides the nitrogen-containing silicon film having a nitrogen concentration lower than the stoichiometric nitrogen concentration of a SiN m, the nitrogen-containing silicon film has a relatively lower nitrogen concentration in the vicinity of the interface between the nitride film and the silicon substrate after the nitriding step, thereby suppressing accumulation of nitrogen in the vicinity of the interface. In addition, the nitrogen-containing silicon film has a relatively higher nitrogen concentration in the vicinity of the top of the nitrogen-containing silicon film after the nitriding step, thereby providing superior characteristics for FETs having the nitrogen-containing gate insulating film.

The above and other objects, features and advantages of the present invention will be more apparent from the following description, referring to the accompanying drawings.

BRIEF DESCRIPTION OF THE DRAWINGS

FIG. 3 is a flowchart showing in detail the process at Step S12 in FIG. 2;

DETAILED DESCRIPTION OF THE PREFERRED EMBODIMENTS

Figure 1:
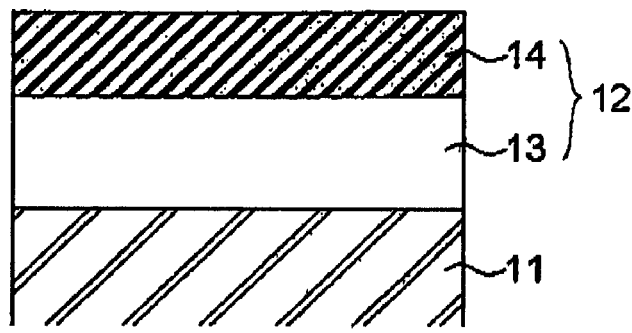
FIG. 1 is a sectional view showing the layer structure of a gate insulating film formed by a method for manufacturing a semiconductor device according to an embodiment of the present invention.

An embodiment of the present invention will be described in further detail with reference to the accompanying drawings. FIG. 1 is a sectional view showing the layer structure of a gate insulating film formed by a method for manufacturing a semiconductor device according to the embodiment of the invention. The gate insulating film 12 includes a $SiO_2$ film 13 and a SiN film 14 consecutively layered on a silicon substrate 11. A gate electrode made of doped polysilicon (not shown) is formed on the gate insulating film 12. Instead of the doped polysilicon, titanium nitride (TiN) or nickel silicide NiSi) may be used for the gate electrode.

Figure 2:
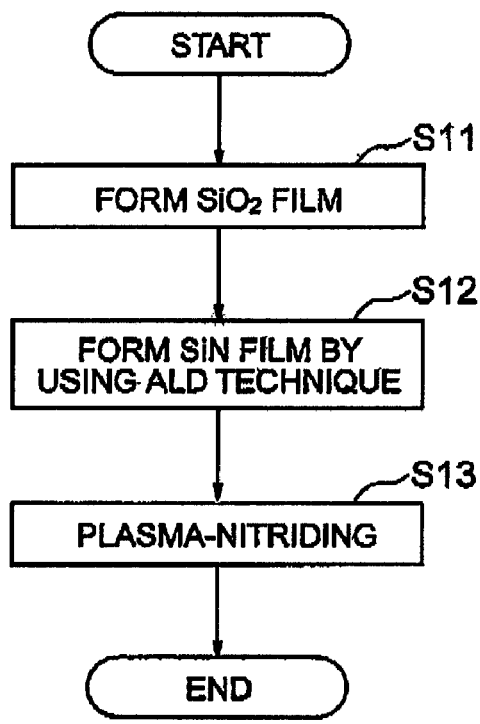
FIG. 2 is a flowchart showing a process of forming the gate insulating film in FIG. 1.

FIG. 2 is a flowchart showing a process of forming the gate insulating film 12 shown in FIG. 1. After an isolation structure (not shown) is formed on the surface portion of the silicon substrate 11, a thermal oxidation process is used to form the $SiO_2$ film 13 on the silicon substrate 11 (Step S11). The resultant wafer (silicon substrate) is then received in a chamber of an ALD system to form the SiN film 14 having a specified thickness using the ALD technique (Step S12). The ALD technique alternately repeats deposition of a monoatomic silicon layer and a plasma-nitriding process on the deposited monoatomic silicon layer. Dichlorosilane is used as a silicon source for the monoatomic silicon layer, and ammonium is used as a nitrogen source for the plasma-nitriding treatment. In Step S12, the process provides a silicon(Si)-rich silicon nitride (SiN) film 14 in which the nitrogen concentration is smaller than 1.33, i.e., the stoichiometric composition ratio of SiN.

FIG. 3 is a flowchart showing in detail the process at Step S12 in FIG. 2. A vertical batch-treatment ALD system is used in this process wherein a plurality of silicon wafers are processed in a batch treatment. Upon deposition of the SiN film 14 by using the ALD technique, a monoatomic silicon layer is first formed (Step S21). The process conditions for depositing the monoatomic silicon layer include, for example, a substrate temperature of 540 degrees C. and a deposition time length of 70 seconds. After the deposition, $N_2$ gas is used for purging the internal of the chamber (Step S22).

A plasma-nitriding process is then conducted using ammonium plasma to nitride the monoatomic silicon layer 21 to thereby form a SiN layer (Step S23). The plasma-nitriding process uses, for example, a substrate temperature of 540 degrees C., a plasma power of 0.3 kW, and a deposition time length of 140 seconds. $N_2$ gas is further used for purging (Step S24). Steps S21 through S24 constituting a single cycle are repeated in 5 to 30 cycles to form the SiN film 14 having a specified thickness.

Figure 4A:
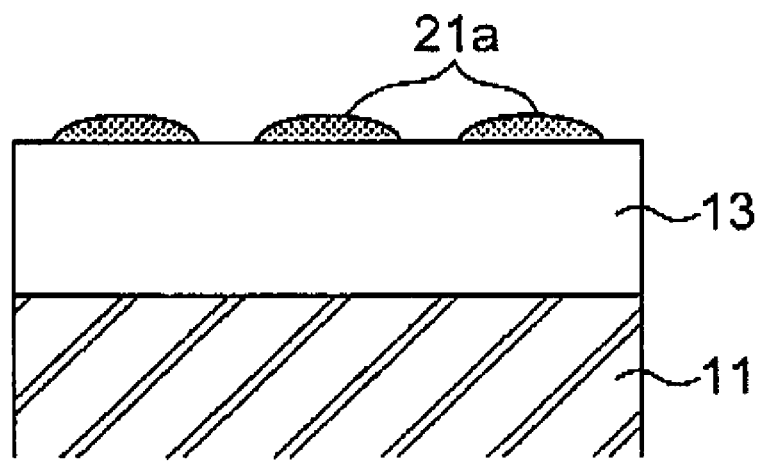
FIG. 4A is a sectional view of the layer structure of the gate insulating film at an initial stage of Step S21 in FIG. 3.
Figure 4B:
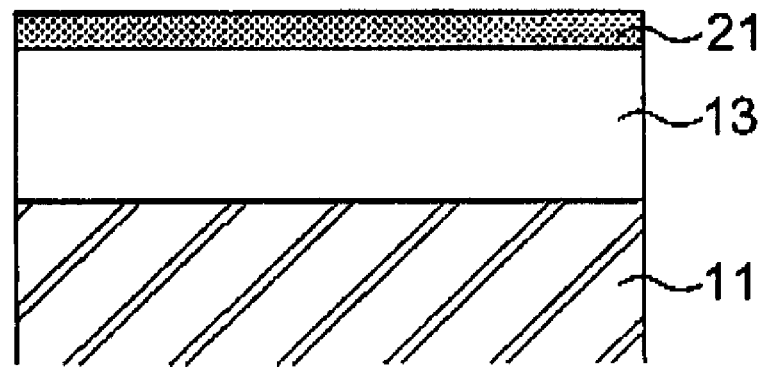
FIG. 4B is a sectional view showing the layer structure of the gate insulating film at a stage succeeding to FIG. 4A.

During the deposition of monoatomic silicon layer in Step S21, a substrate temperature of lower than 500 degrees C., if used, allows the silicon to deposit in the form of silicon islands 21a on the $SiO_2$ film 13, as shown in FIG. 4A. On the other hand, a substrate temperature of 500 degrees C. or above allows the silicon to deposit in the form of a monoatomic silicon layer 21 covering the entire surface of the $SiO_2$ film 13, as shown in FIG. 4B.

Accordingly, if a substrate temperature of lower than 500 degrees C. is used, and the deposition step is stopped at the state of FIG. 4A, the SiN layer obtained from the silicon islands 21a shown in FIG. 4A has a similar island structure. The island structure of the SiN layer exposes therefrom the $SiO_2$ film 13, whereby the plasma-nitriding process at Step S23 allows the plasma nitrogen to enter the $SiO_2$ film 13 through the exposed surface thereof. This causes the problem of the nitrogen existing in the vicinity of the interface of the gate insulating film 12 with respect to the silicon substrate 11. Thus, a substrate temperature of 500 degrees C. or above should be used for depositing the monoatomic silicon layer at Step S21, thereby allowing the deposited monoatomic silicon layer 21 to cover the entire surface of the $SiO_2$ film 13, as shown in FIG. 4B.

Turning back to FIG. 2, after the SiN film 14 is formed, the wafer is received in a plasma-nitriding chamber. A plasma-nitriding process, referred to as post plasma-nitriding process in this text, is then conducted at a substrate temperature of 550 degrees C. or lower (Step S13). The post plasma-nitriding process conducted at a substrate temperature of 550 degrees C. or lower prevents the nitrogen from diffusing toward the vicinity of the interface between the gate insulating film 12 and the silicon substrate 11, and yet locally nitrides the vicinity of the top of the gate insulating film 12. Accordingly, it is possible to suppress the nitrogen concentration from increasing in the vicinity of the interface between the gate insulating Film 12 and the silicon substrate 11, and to approximate the N/Si composition ratio of the SiN film 14 to the stoichiometric composition ratio of SiN. The conditions of the post plasma-nitriding process are such that the substrate temperature is between the room temperature and 550 degrees C., the chamber pressure is between 40 mTorr and 1000 mtorr, and the plasma power is between 500 watts and 3000 watts.

According to the present embodiment, use of the ALD technique provides a high-quality SiN film 14 which is superior in controllability of the film thickness and composition and in the in-plane uniformity. The ALD technique is used to form the Si-rich SiN film 14 in which the nitrogen concentration is smaller than 1.33, i.e., the stoichiometric composition ratio of SiN. This makes it possible to suppress the nitrogen from diffusing toward the vicinity of the interface between the gate insulating film 12 and the silicon substrate 11. The formation of the SiN film 14 using the ALD technique includes deposition of the monoatomic silicon layer 21 at Step S21, which covers the entire surface of the $SiO_2$ film 13 and therefore prevents the nitrogen from diffusing into the $SiO_2$ film 13.

After the SiN film 14 is formed using the ALD technique, the post plasma-nitriding process is performed at a substrate temperature of 550 degrees C. or below. This process prevents the nitrogen from diffusing toward the vicinity of the interface between the gate insulating film 12 and the silicon substrate 11, and locally nitrides the vicinity of the top of the gate insulating film 12, thereby approximating the N/Si composition ratio of the SiN film 14 to the stoichiometric composition ratio of SiN.

As described above, the method of the present embodiment prevents the nitrogen from diff-using toward the vicinity of the interface between the gate insulating film 12 and the silicon substrate 11, and yet effectively increases the nitrogen concentration in the vicinity of the top of the gate insulating film 12. The decrease in the nitrogen in the vicinity of the interface decreases the fixed charge in the gate insulating film 12, thereby suppressing the FET characteristics from degrading and forming an FET having superior characteristics.

To confirm the advantages of the embodiment, a sample of the semiconductor device was manufactured, having a gate insulating film manufactured by the method of the embodiment. The conditions of the post plasma-nitriding process at Step S13 were such that the substrate temperature was 480 degrees C., the chamber pressure was 500 mTorr, and the plasma power was 2000 W.

For the purpose of comparison with the sample semiconductor device, first to fifth comparative examples of semiconductor device were also manufactured by using a process without using the post plasma-nitriding process. The process for the first comparative example was such that the process was similar to the above embodiment except for the post plasma-nitriding process at Step S13. The first comparative example was selected from samples of the embodiment at the stage prior to the post plasma-nitriding process, for the purpose of investigating the nitrogen concentration before the post plasma-nitriding process.

The process for the second to fifth comparative examples was such that the ALD process is modified to increase the nitrogen concentration in the SiN film 14 without conducting the post plasma-nitriding process. The second comparative example was manufactured by a process wherein the time length of the Step S21 for depositing the monoatomic film was reduced, whereas the process for the third comparative example was such that the substrate temperature was lowered to suppress decomposition of the precursor in Step S21. In these second and third comparative examples, reduction of the grown amount of the monoatomic silicon layer 21 at Step S21 was expected to provide an increase in the nitrogen concentration in the SiN film 14.

The process for the fourth comparative example was such that the plasma power used at Step S23 in FIG. 3 was increased, whereas the process for the fifth comparative example was such that the substrate temperature at Step S23 in FIG. 3 was raised. In these fourth and fifth comparative examples, the plasma-nitriding process at Step S23 was enhanced such that the N/Si composition ratio in the SiN film 14 almost equals the stoichiometric composition ratio of SiN.

Figure 5:
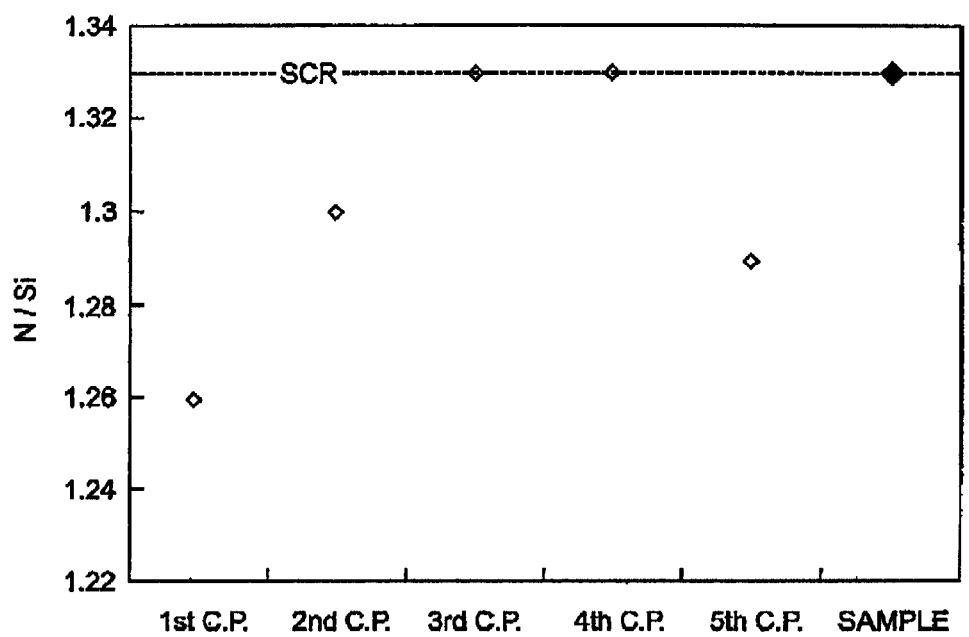
FIG. 5 is a graph showing the N/Si composition ratio measured by the RBS technique in semiconductor devices manufactured according to the embodiment and first through fifth comparative examples.
Figure 6:
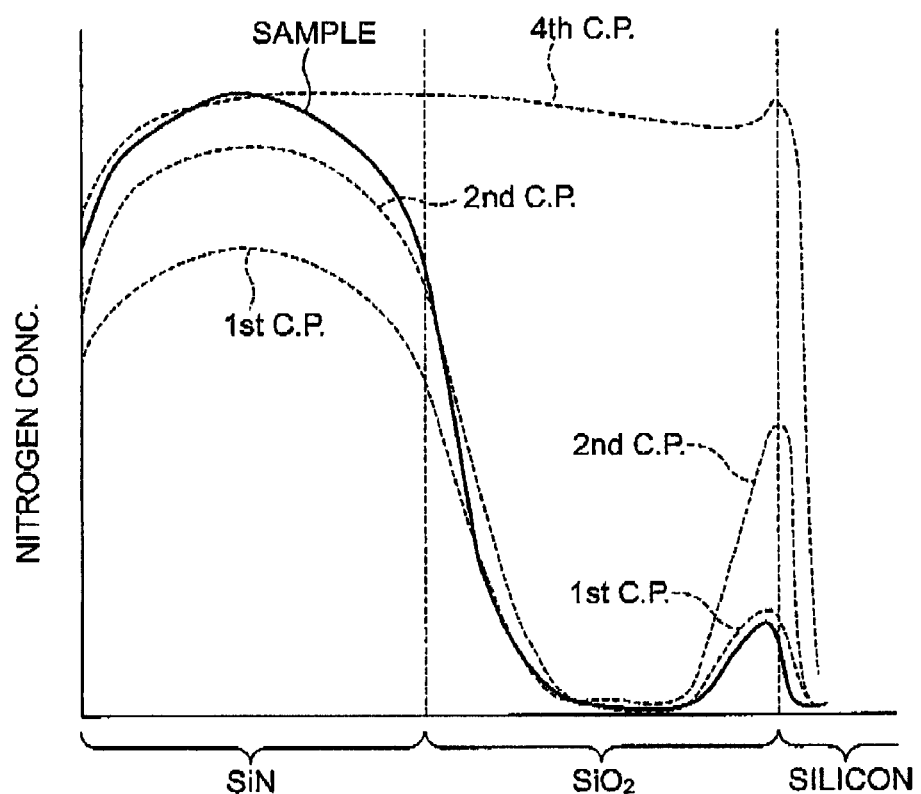
FIG. 6 is a graph showing nitrogen concentrations in the film measured by the SIMS technique in the semiconductor devices manufactured according to the embodiment and fist, second and fourth comparative examples.

FIG. 5 shows the N/Si composition ratio in the SiN film 14 measured by the Rutherford Back Scattering (RBS) technique on the sample of the embodiment and the first to fifth comparative examples. FIG. 6 shows a profile of the nitrogen concentration measured by the Secondary Ion Mass Spectrometry (SIMS) technique on the sample and first, second and fourth comparative examples. In the graph of FIG. 6, the abscissa indicates a depth from the top of the gate insulating film 12, whereas the ordinate indicates the amount of nitrogen per unit film thickness. In FIG. 5, the N/Si composition ratio represents the value measured at the center of the SiN film 14 as viewed in the thickness direction thereof. SCR plotted on the ordinate represents the stoichiometric composition ratio.

As understood from FIG. 5, the sample semiconductor device had an increased nitrogen concentration in the SiN film 14 as compared to the semiconductor device of the first comparative example. It will be also understood that the N/Si composition ratio of the SiN film 14 in the sample almost equals the stoichiometric composition ratio of SiN. The nitrogen concentration in the vicinity of the interface between the SiN film 14 and the silicon substrate 11 almost equals that of the semiconductor device of the first comparative example. The semiconductor devices of the second to fifth comparative examples have an increased nitrogen concentration in the SiN film 14 as compared to the semiconductor device of the first comparative example; however, the nitrogen concentration in the vicinity of the interface between the SiN film 14 and the silicon substrate 11 was also significantly increased.

The fact that semiconductor devices of the second and third comparative examples had an increased nitrogen concentration in the vicinity of the interface with respect to the silicon substrate 11 may be attributable to the following reason. Since the growth of the monoatomic silicon layer 21 is suppressed at Step S21 in FIG. 3, the plasma nitriding is effected at Step S23 with the silicon being deposited in the state of silicon islands 21a, as shown in FIG. 4A. Thus, the nitrogen diffused into the SiO$_2$ film 13 through the exposed surface thereof during the plasma-nitriding process at Step S23. In view of the above, the method of the present embodiment provides the monoatomic silicon layer 21 at Step S21 so as to cover the entire surface of the SiO$_2$ film 13, as shown in FIG. 4B. For this purpose, deposition of the monoatomic silicon layer uses a substrate temperature of 500 degrees C. or higher.

The fact that the semiconductor devices of the fourth and fifth comparative examples had an increased nitrogen concentration in the vicinity of the interface with respect to silicon substrate 11 is attributable to the following reason. Since the plasma-nitriding process was enhanced at Step S23 in FIG. 3, a larger amount of nitrogen diffused into the SiO$_2$ film 13. In view of the above, the method of the present embodiment provides, during forming the SiN film 14 at Step S12, a Si-rich silicon nitride film 14 having a N/Si composition ratio smaller than the stoichiometric composition ratio of SiN, for the purpose of preventing the nitrogen from diffusing toward the vicinity of the interface with respect to the silicon substrate 11.

In addition, the formation of the SiN film 14 using the ALD technique is followed by the post plasma-nitriding process using a substrate temperature of 550 degrees C. or lower at Step S13. In this manner, the method of the present embodiment prevents the nitrogen from diffusing toward the vicinity of the interface with respect to the silicon substrate 11, and yet locally nitrides the vicinity of the top of the gate insulating film 12.

Figure 7:
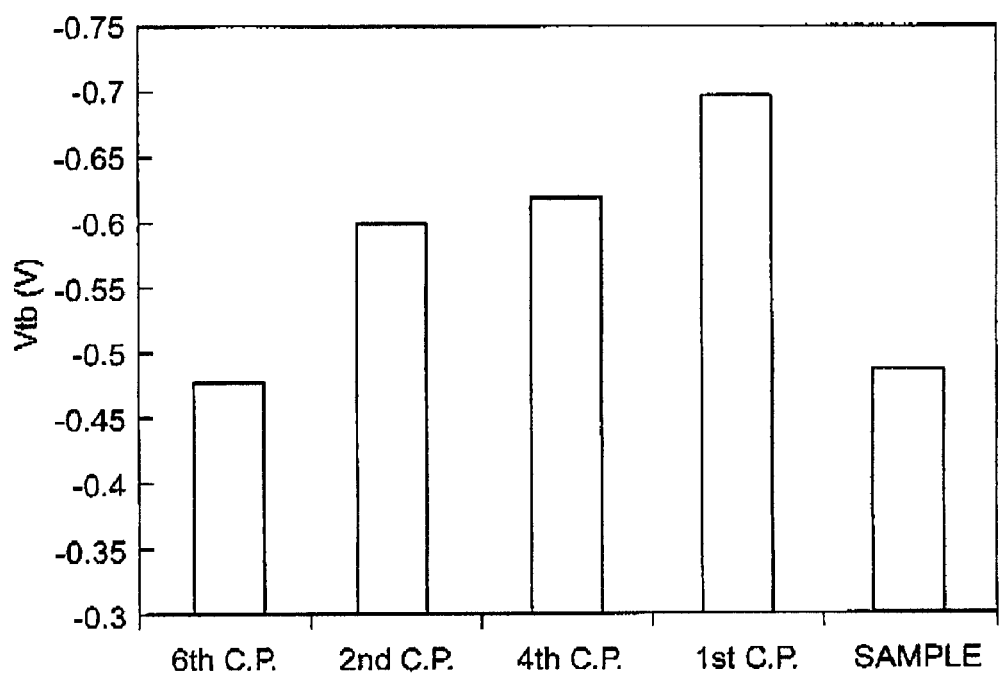
FIG. 7 is a graph showing the flat-band voltage $V_{fb}$ measured in the semiconductor devices manufactured according to the embodiment and first, second, fourth and sixth comparative examples.

For the purpose of comparison with the sample semiconductor device, a semiconductor device of a sixth comparative example having a single-layer gate insulating film 12 configured by a SiO$_2$ film was manufactured. The flat-band voltages V$_{fb}$ for the semiconductor devices of the sample and first, second, fourth and sixth comparative examples was investigate, the result of which is shown in FIG. 7. The fixed charge generated by the nitrogen is positive charge. In FIG. 7, a larger absolute value of the flat-band voltage V$_{fb}$ means a larger amount of the fixed charge.

FIG. 7 reveals that the sample semiconductor device had a remarkably reduced absolute value for the flat-band voltage V$_{fb}$ as compared to the semiconductor device of the first comparative example. The absolute value; almost equaled that of the semiconductor device of the sixth comparative example having a gate insulating film 12 configured by SiO$_2$. In this result, it is deduced that the fixed charge is reduced in the sample of the present embodiment. The semiconductor devices of the second, fourth and sixth comparative examples had a reduced absolute value for the flat-band voltage V$_{fb}$ as compared to the semiconductor device of the first comparative example; however, the reduction is smaller as to compared to the sample. This is because the nitrogen in these comparative examples is accumulated in the vicinity of the interface between the gate insulating film 12 and the silicon substrate 11.

As described heretofore, the method of the present invention has the following aspects.

The nitriding step uses a plasma-nitriding technique and a substrate temperature of 550 degrees C. or below. This temperature suppresses the nitrogen from diffusing toward the interface between the gate insulating film and the silicon substrate and yet locally nitrides the vicinity of the top of the nitrogen-containing silicon film.

The method further includes, before the nitrogen-containing silicon film forming step, the step of forming a silicon oxide film on the silicon substrate. The silicon oxide film containing therein no nitrogen prevents accumulation of nitrogen in the vicinity of the interface with respect to the silicon substrate.

The nitrogen-containing silicon film forming step includes the steps of depositing a monoatomic silicon layer and nitriding the monoatomic silicon layer, which steps are repeated in a plurality of times. This process achieves a superior controllability in the film thickness and composition, and a superior in-plane uniformity for the resultant gate insulating film.

The monoatomic silicon layer depositing step uses a substrate temperature of 500 degrees C. or above, as well as the subsequent nitriding step. The substrate temperature, 500 degrees C. or above, in the deposition step allows the resultant monoatomic silicon layer covers the entire surface of the underlying structure, suppressing nitrogen used in the nitriding step from diffusing toward the underlying structure.

The nitriding step preferably nitrides the nitrogen-containing silicon film such that a nitrogen concentration in a vicinity of an interface between the nitrogen-containing silicon film and the silicon substrate is lower in a vicinity of top surface of the nitrogen-containing silicon film which is far from the silicon substrate.

The nitrogen-containing silicon film may be a SiON film.

Since the above embodiments are described only for examples, the present invention is not limited to the above embodiments and various modifications or alterations can be easily made therefrom by those skilled in the art without departing from the scope of the present invention.

What is claimed is:

1. A method for manufacturing a semiconductor device comprising the steps of:
    forming a nitrogen-containing silicon film on a silicon substrate, said nitrogen-containing silicon film having a nitrogen concentration lower than a stoichiometric nitrogen concentration of a SiN film; and
    nitriding said nitrogen-containing silicon film to form a nitrogen-containing gate insulating film,
    wherein said nitrogen-containing silicon film forming step comprises the steps of depositing a monoatomic silicon layer,
    wherein said nitriding said nitrogen-containing silicon film step nitrides said nitrogen-containing silicon film such that a nitrogen concentration in a vicinity of an interface between said nitrogen-containing silicon film and said silicon substrate is lower than in a vicinity of a top surface of said nitrogen-containing silicon film which is far from said silicon substrate.

2. The method according to claim 1, wherein said nitriding step uses a plasma-nitriding technique and a substrate temperature of 550 degrees C. or below.

3. The method according to claim 1, further comprising, before said nitrogen-containing silicon film forming step, the step of forming a silicon oxide film on said silicon substrate.

4. The method according to claim 1, wherein said nitrogen-containing silicon film forming step further comprises nitriding said monoatomic silicon layer, and wherein said steps of depositing a monoatomic silicon layer and nitriding said monoatomic silicon layer are repeated a plurality of times.

5. The method according to claim 4, wherein said monoatomic silicon layer nitriding step uses a plasma-nitriding technique and a substrate temperature of 500 degrees C. or above.

6. The method according to claim 1, wherein said monoatomic silicon layer depositing step uses a substrate temperature of 500 degrees C. or above.

7. The method according to claim 1, wherein said nitrogen-containing silicon film is a SiON film.

8. A method comprising:
    performing a sequence of depositing a monoatomic silicon layer on a substrate and nitriding the monoatomic silicon layer;
    repeating the sequence a plurality of times to form a silicon-rich silicon nitride film having a nitrogen concentration smaller than a stoichiometric composition ratio of a silicon nitride; and
    nitriding the silicon-rich silicon nitride film to convert a part of the silicon-rich silicon nitride film to a nitride film having a nitrogen concentration larger than the silicon-rich silicon nitride film.

9. The method according to claim 8, further comprising forming a silicon dioxide film on the substrate by using a thermal oxidation method before performing the sequence.

10. The method according to claim 8, wherein the depositing the monoatomic silicon layer is performed under a substrate temperature of 500 degrees C. or above.

11. The method according to claim 8 wherein the nitriding the monoatomic layer is performed using a plasma-nitriding method, and the nitriding the silicon-rich silicon nitride film is performed using a plasma-nitriding method.

12. The method according to claim 11 wherein a plasma power of the nitriding the silicon-rich silicon nitride film is higher than a plasma power of the nitriding the monoatomic silicon layer.

13. The method according to claim 11, wherein a substrate temperature of the nitriding the silicon-rich silicon nitride film is lower than a substrate temperature of the nitriding the monoatomic silicon layer.

14. The method according to claim 11, wherein the nitriding the monoatomic silicon layer is performed under a substrate temperature being 500 degrees C. or above,
    wherein the nitriding the silicon-rich silicon film is performed under a substrate temperature being 550 degrees C. or below.

15. A method comprising:
    forming a silicon dioxide film on a substrate by using a thermal oxidation method;
    forming a silicon-rich silicon nitride film on the silicon dioxide film by using an atomic layer deposition method, and
    converting a part of the silicon-rich silicon nitride film to a stoichiometric silicon nitride film,
    wherein the converting a part of the silicon-rich silicon nitride film converts a top surface of the silicon-rich silicon nitride film to have a nitrogen concentration larger than a bottom surface of the silicon-rich silicon nitride film;

wherein the bottom surface of the silicon-rich nitride film is closed to the substrate than the top surface.

16. The method according to claim 15, wherein the forming the silicon-rich silicon nitride film is performed at a substrate temperature of 500 degrees C. or above.

17. The method according to claim 15, wherein the converting comprises a plasma-nitriding method.

18. The method according to claim 15, wherein a substrate temperature of the converting the silicon-rich nitride film is lower than a substrate temperature of the forming the silicon-rich nitride film.

* * * * *